United States Patent
Liao et al.

(10) Patent No.: US 11,538,653 B2
(45) Date of Patent: Dec. 27, 2022

(54) ION BEAM LITHOGRAPHY METHOD BASED ON ION BEAM LITHOGRAPHY SYSTEM

(71) Applicant: Beijing Normal University, Beijing (CN)

(72) Inventors: Bin Liao, Beijing (CN); Xiaoping Ouyang, Beijing (CN); Jun Luo, Beijing (CN); Xu Zhang, Beijing (CN); Lin Chen, Beijing (CN); Pan Pang, Beijing (CN); Xianying Wu, Beijing (CN); Minju Ying, Beijing (CN)

(73) Assignee: Beijing Normal University, Beijing (CN)

( * ) Notice: Subject to any disclaimer, the term of this patent is extended or adjusted under 35 U.S.C. 154(b) by 274 days.

(21) Appl. No.: 16/882,978

(22) Filed: May 26, 2020

(65) Prior Publication Data

US 2021/0183616 A1 Jun. 17, 2021

(30) Foreign Application Priority Data

Dec. 13, 2019 (CN) .......................... 201911280496.1

(51) Int. Cl.
*H01J 37/08* (2006.01)
*H01J 37/317* (2006.01)
(Continued)

(52) U.S. Cl.
CPC .......... *H01J 37/08* (2013.01); *H01J 37/3175* (2013.01); *H05K 3/027* (2013.01); *H05K 3/108* (2013.01);
(Continued)

(58) Field of Classification Search
CPC .. H05K 3/108; H05K 3/027; H05K 2203/092; H05K 2203/095;
(Continued)

(56) References Cited

U.S. PATENT DOCUMENTS

| | | | | |
|---|---|---|---|---|
| 6,001,431 A | * | 12/1999 | Itoh ...................... | C23C 16/509 427/249.7 |
| 7,264,850 B1 | * | 9/2007 | Itoh ...................... | C23C 16/545 427/523 |

(Continued)

FOREIGN PATENT DOCUMENTS

| | | | | | |
|---|---|---|---|---|---|
| JP | 2008512877 A | * | 4/2008 | ............... | H05K 1/16 |
| WO | WO-0242514 A1 | * | 5/2002 | ............ | C23C 14/022 |

*Primary Examiner* — Jeffrey T Carley
(74) *Attorney, Agent, or Firm* — Troutman Pepper Hamilton Sanders LLP; Christopher C. Close (57) ABSTRACT

The present invention discloses an ion beam lithography method based on an ion beam lithography system. The ion beam lithography system includes a roll-roll printer placed in a vacuum, and a medium-high-energy wide-range ion source, a medium-low-energy wide-range ion source and a low-energy ion source installed on the roll-roll printer. The ion beam lithography method includes: first coating a polyimide (PI) substrate with a dry film, etching the dry film according to a preset circuit pattern, then using the ion beam lithography system to deposit a wide-energy-range metal ion on the circuit pattern to form a film substrate, and finally stripping the dry film off the film substrate to obtain a printed circuit board (PCB).

9 Claims, 5 Drawing Sheets (51) Int. Cl.
*H05K 3/02* (2006.01)
*H05K 3/10* (2006.01)

(52) U.S. Cl.
CPC .............. *H01J 2237/0815* (2013.01); *H01J 2237/31788* (2013.01); *H01L 2224/11622* (2013.01); *H05K 2201/0154* (2013.01); *H05K 2203/092* (2013.01); *H05K 2203/095* (2013.01)

(58) Field of Classification Search
CPC ... H01J 2237/31788; H01J 2237/31755; H01J 37/3175
See application file for complete search history.

(56) References Cited

U.S. PATENT DOCUMENTS

| | | | |
|---|---|---|---|
| 2001/0012570 A1* | 8/2001 | Egitto | C23C 8/00 428/615 |
| 2005/0073047 A1* | 4/2005 | Miura | C25D 5/10 257/734 |
| 2006/0068173 A1* | 3/2006 | Kajiyama | C23C 18/1612 118/620 |
| 2006/0228634 A1* | 10/2006 | Bret | C23F 4/00 430/5 |
| 2008/0083706 A1* | 4/2008 | Kirmeier | B23K 26/361 219/72 |
| 2009/0325387 A1* | 12/2009 | Chen | H01J 37/32862 216/60 |
| 2012/0067632 A1* | 3/2012 | Nakai | H05K 3/027 29/846 |
| 2018/0210353 A1* | 7/2018 | Nishimura | G03F 9/7049 |
| 2020/0178402 A1* | 6/2020 | Tsai | H05K 1/028 |

* cited by examiner

ION BEAM LITHOGRAPHY METHOD BASED ON ION BEAM LITHOGRAPHY SYSTEM

CROSS REFERENCE TO RELATED APPLICATIONS

This application claims priority, and benefit under 35 U.S.C. § 119(e) of Chinese Patent Application No. 201911280496.1 filed 13 Dec. 2019. The disclosure of the prior application is hereby incorporated by reference as if fully set forth below.

TECHNICAL FIELD

The present invention relates to the technical field of electronic circuit printing, and in particular, to an ion beam lithography method based on an ion beam lithography system.

BACKGROUND

The scientific development, especially the rapid development of the electronic information industry, imposes higher requirements for electronic circuits. Nowadays, consumers are more obsessed with compact lightweight electronic products with low-energy consumption. The demand and development trend of lightweight and miniaturization requires the line width and spacing of electronic circuits to be increasingly small. With the decrease of the line width and spacing, the existing etching methods can hardly infiltrate or can only infiltrate part of the etching liquid into the slot due to the surface tension of the etching liquid. As a result, the slot cannot be etched completely, which makes it difficult for the prepared electronic circuit to meet the design requirements. In addition, the existing etching methods are difficult to achieve the line width and spacing of 20 μm below, and are also difficult to achieve a high yield and a low preparation cost. This has become the technical bottleneck that limits the development of the electronic information industry.

SUMMARY

An objective of the present invention is to provide an ion beam lithography method based on an ion beam lithography system. The present invention solves the problems that the line width and spacing of an electronic circuit made by the existing etching method can hardly be 20 μm or less and a prepared printed circuit board (PCB) has a low yield and a high cost.

To achieve the above purpose, the present invention provides the following technical solution.

An ion beam lithography method based on an ion beam lithography system includes a roll-roll printer placed in a vacuum, and a medium-high-energy wide-range ion source, a medium-low-energy wide-range ion source and a low-energy ion source installed on the roll-roll printer; and the ion beam lithography method includes:

preparing a polyimide (PI) substrate;

coating a dry film on a surface of the PI substrate;

etching the dry film according to a preset circuit pattern to form an etched substrate;

using the ion beam lithography system to deposit a wide-energy-range metal ion on the preset circuit pattern of the etched substrate to form a metal film substrate; and stripping the dry film off the surface of the metal film substrate to obtain a printed circuit board (PCB).

Optionally, the wide-energy-range metal ion is a nickel or copper ion, and the wide-energy-range metal ion has an energy range of 30 ev to 20 Kev.

Optionally, the using the ion beam lithography system to deposit a wide-energy-range metal ion on the preset circuit pattern of the etched substrate to form a metal film substrate specifically includes:

using a medium-high-energy wide-range ion beam generated by the medium-high-energy wide-range ion source to perform surface treatment at a position of the preset circuit pattern on the surface of the etched substrate, to form a surface-treated substrate;

using a medium-low-energy wide-range ion beam generated by the medium-low-energy wide-range ion source to deposit an ultra-thin metal layer at the position of the preset circuit pattern on the surface of the surface-treated substrate, to form an ultra-thin metal layer deposited substrate; and using a low-energy ion beam generated by the low-energy ion source to deposit a thick metal layer at the position of the preset circuit pattern on the surface of the ultra-thin metal layer deposited substrate, to form a metal film substrate.

Optionally, the using a medium-high-energy wide-range ion beam generated by the medium-high-energy wide-range ion source to perform surface treatment at a position of the preset circuit pattern on the surface of the etched substrate to form a surface-treated substrate specifically includes:

using the medium-high-energy wide-range ion source to implant a medium-high-energy wide-range ion beam at the position of the preset circuit pattern on the surface of the etched substrate, where an implantation voltage is 8-30 kV, a beam intensity is 1-10 mA, an implantation dose is $1\times10^{15}$ to $1\times10^{16}$ ions/cm$^2$, and an implantation depth is 70-120 nm.

Optionally, the using a medium-low-energy wide-range ion beam generated by the medium-low-energy wide-range ion source to deposit an ultra-thin metal layer at the position of the preset circuit pattern on the surface of the surface-treated substrate to form an ultra-thin metal layer deposited substrate specifically includes:

using the medium-low-energy wide-range ion source to deposit an ultra-thin metal layer at the position of the preset circuit pattern on the surface of the surface-treated substrate by means of magnetic filtration deposition to form an ultra-thin metal layer deposited substrate, where the magnetic filtration deposition uses an arc current of 90-150 A and an elbow magnetic field current of 1.0-4.0 A.

Optionally, the using a low-energy ion beam generated by the low-energy ion source to deposit a thick metal layer at the position of the preset circuit pattern on the surface of the ultra-thin metal layer deposited substrate to form a metal film substrate specifically includes:

using the low-energy ion source to further deposit a thick metal layer at the position of the preset circuit pattern on the surface of the ultra-thin metal layer deposited substrate by means of magnetic filtration deposition to form a metal film substrate, where the magnetic filtration deposition uses an arc current of 100-150 A and an elbow magnetic field current of 2.0-4.0 A.

Optionally, the medium-high-energy wide-range ion source forms a plasma by cathode pulse triggering, and the plasma is extracted through a magnetic tube; a medium-high-energy radio frequency (RF) power supply is provided outside a lead-out anode; the medium-high-energy RF power supply has a current range of 0-1000 V and a frequency range of 0.1-3 MHz.

Optionally, the medium-low-energy wide-range ion source forms a plasma by direct current (DC) triggering; the plasma is extracted through a magnetic tube; a medium-low-energy RF power supply is provided outside the extraction tube; the medium-low-energy RF power supply has a current range of 0-100 V and a frequency range of 0.1-3 MHz.

Optionally, the low-energy ion source forms a plasma by DC triggering, and the plasma is extracted through a magnetic tube; there is no RF power supply provided outside the magnetic extraction tube, but a lead-out magnetic field is provided on the extraction tube.

According to the specific embodiments provided by the present invention, the present invention discloses the following technical effects.

The present invention discloses an ion beam lithography method based on an ion beam lithography system. The ion beam lithography system includes a roll-roll printer placed in a vacuum, and a medium-high-energy wide-range ion source, a medium-low-energy wide-range ion source and a low-energy ion source installed on the roll-roll printer. The ion beam lithography method includes: first coating a polyimide (PI) substrate with a dry film, etching the dry film according to a preset circuit pattern, then using the ion beam lithography system to deposit a wide-energy-range metal ion on the circuit pattern to form a film substrate, and finally stripping the dry film off the film substrate to obtain a PCB. By depositing the wide-energy-range metal ion by the ion beam lithography system, the present invention prepares an ultra-fine circuit with a line width and a line spacing of less than 3 μm, and obtains a deposited film that is dense and smooth. The present invention achieves a low production cost and a high yield, and is suitable for applications such as high-frequency and high-speed transmission. In addition, since the present invention does not have the problem that an electroplating solution pollutes the environment, the present invention is energy-saving and environment-friendly.

BRIEF DESCRIPTION OF DRAWINGS

To describe the technical solutions in the embodiments of the present invention or in the prior art more clearly, the following briefly describes the accompanying drawings required for the embodiments. Apparently, the accompanying drawings in the following description show merely some embodiments of the present invention, and a person of ordinary skill in the art may still derive other accompanying drawings from these accompanying drawings without creative efforts.

REFERENCE NUMERALS

201. first medium-high-energy wide-range ion source, 202. cold roll, 203. auxiliary roll, 204. first medium-low-energy wide-range ion source, 205. cold roll, 206. second medium-low-energy wide-range ion source, 207. stainless steel chamber, 208. third medium-low-energy wide-range ion source, 209. second stainless steel chamber partition, 210. rewinding roll, 211. lower right vacuum chamber, 212. low-energy ion source, 213. cold roll, 214 second medium-high-energy wide-range ion source, 215. first collimation detector, 216. left vacuum chamber, 217. unwinding chamber, 218. second collimation detector, and 219. first stainless steel chamber partition.

DETAILED DESCRIPTION

The technical solutions in the embodiments of the present invention are described clearly and completely with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

An objective of the present invention is to provide an ion beam lithography method based on an ion beam lithography system. The present invention solves the problems that the line width and spacing of an electronic circuit made by the existing etching method can hardly be 20 μm or less and a prepared printed circuit board (PCB) has a low yield and a high cost.

To make the above objectives, features, and advantages of the present invention more obvious and easy to understand, the present invention will be further described in detail with reference to the accompanying drawings and the detailed description.

Figure 1:
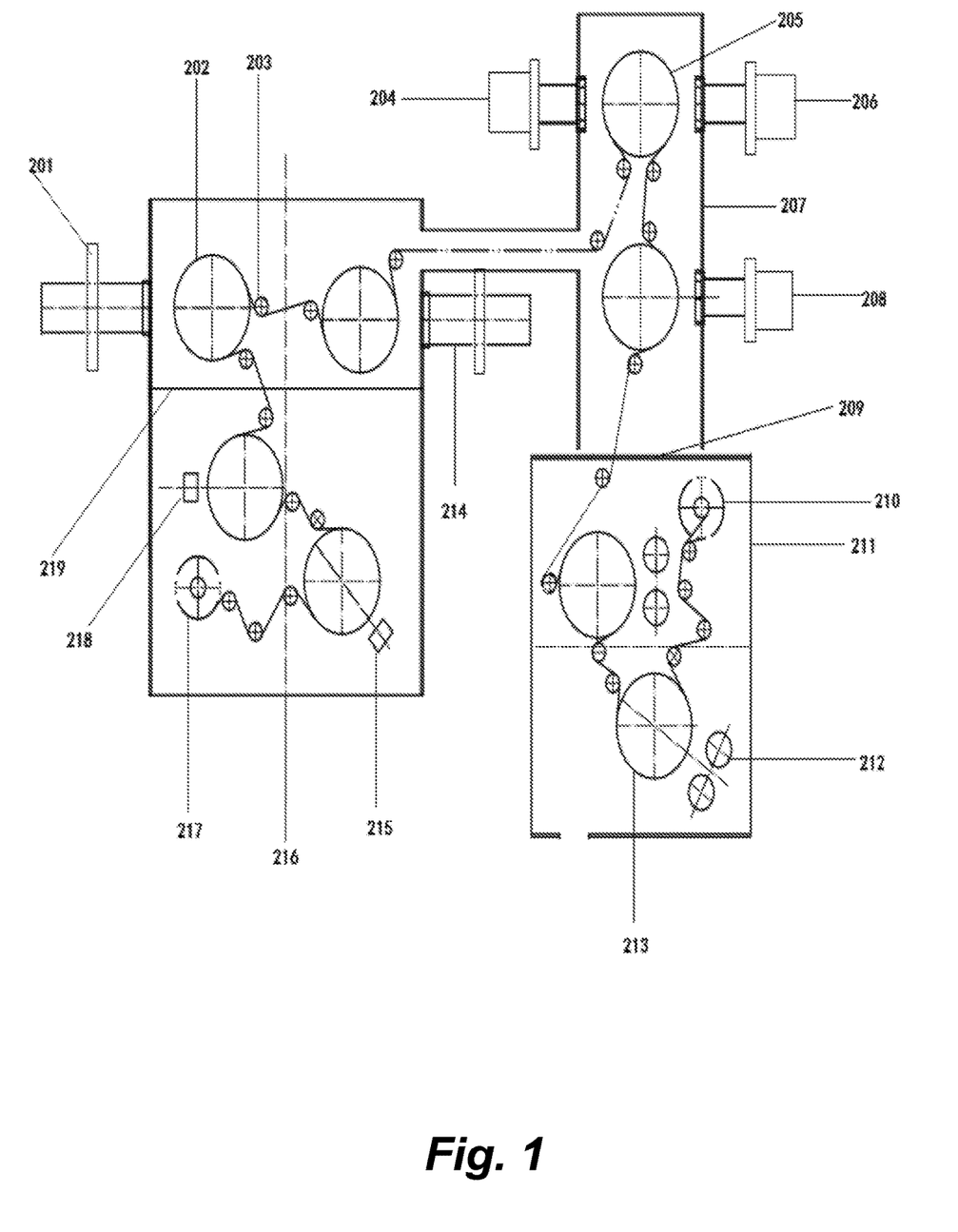
FIG. 1 is a structural diagram of an ion beam lithography system provided by the present invention.
Figure 2:
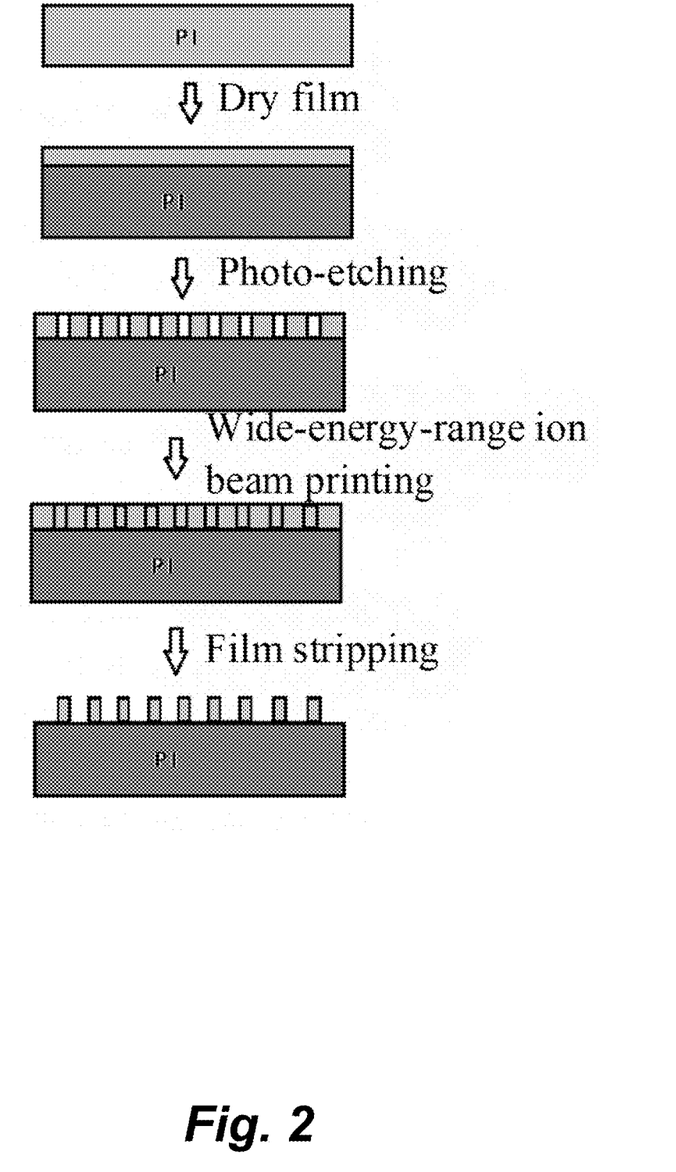
FIG. 2 is a flowchart of an ion beam lithography method based on an ion beam lithography system provided by the present invention.

FIG. 1 is a structural diagram of an ion beam lithography system provided by the present invention. FIG. 2 is a flowchart of an ion beam lithography method based on an ion beam lithography system provided by the present invention. As shown in FIG. 1 and FIG. 2, an ion beam lithography method according to the present invention is based on an ion beam lithography system. The ion beam lithography system includes a roll-roll printer placed in a vacuum, and a medium-high-energy wide-range ion source, a medium-low-energy wide-range ion source and a low-energy ion source 212 installed on the roll-roll printer. The medium-high-energy wide-range ion source includes a first medium-high-energy wide-range ion source 201 and a second medium-high-energy wide-range ion source 214. The medium-low-energy wide-range ion source includes a first medium-low-energy wide-range ion source 204, a second medium-low-energy wide-range ion source 206 and a third medium-low-energy wide-range ion source 208. The roll-roll printer includes a cold roll (202, 205, 213), an auxiliary roll 203, a rewinding roll 210, a collimation detector (215, 218), an unwinding chamber 217 and other necessary components. These components of the roll-roll printer are respectively placed in a vacuum environment provided by a left vacuum chamber 216, a stainless steel chamber 207 and a lower right vacuum chamber 211.

Specifically, the left vacuum chamber 216 is connected to the stainless steel chamber 207 through a connection channel, and a lower side of the stainless steel chamber 207 is connected to the lower right vacuum chamber 211. The left vacuum chamber 216 is provided therein with a first stainless steel chamber partition 219. The partition 219 is mainly to maintain a pressure difference of $10^3$ Pa between upper and lower portions of the left vacuum chamber 206. The stainless steel chamber 207 and the lower right vacuum chamber 211 form a second stainless steel chamber partition 209 there-between. The partition 209 is mainly to maintain a pressure difference of $10^3$ Pa between the stainless steel chamber 207 and the lower right vacuum chamber 211. The first medium-high-energy wide-range ion source 201 and the second medium-high-energy wide-range ion source 214 are respectively disposed on two sides of the left vacuum chamber 216. The first medium-low-energy wide-range ion source 204 is disposed on one side of the stainless steel chamber 207, while the second medium-low-energy wide-range ion source 206 and the third medium-low-energy wide-range ion source 208 are disposed on the other side of the stainless steel chamber the chamber 207. Two low-energy ion sources 212 are disposed inside the lower right vacuum chamber 211. There are least two medium-high-energy wide-range ion sources, two medium-low-energy wide-range ion sources and two low-energy ion sources provided to realize the front and back printing of an electronic circuit.

As shown in FIG. 1 and FIG. 2, the ion beam lithography method includes:

Step 1: prepare a polyimide (PI) substrate.

Step 2: coat a dry film on a surface of the PI substrate.

Step 3: etch the dry film according to a preset circuit pattern to form an etched substrate.

The dry film is photo-etched based on the designed preset circuit pattern to obtain the required preset circuit pattern. Specifically, the dry film is etched by using ultraviolet light or by other means to form the required circuit pattern. Then, based on the obtained etched substrate, wide-energy-range ion beam lithography is performed, that is, wide-energy-range ion beam deposition is performed on the obtained circuit pattern by using an ion beam technique. Because the radius of an ion is on the order of $10^{-10}$ m, there are no problems such as incomplete circuit and inconsistent shape due to the narrow circuit during the ultra-fine ion beam processing. Finally, the remaining dry film is removed to obtain a PCB printed with the preset circuit pattern.

Step 4: use the ion beam lithography system to deposit a wide-energy-range metal ion on the preset circuit pattern of the etched substrate to form a metal film substrate.

First, a medium-high-energy wide-range ion beam generated by the first medium-high-energy wide-range ion source 201 and the second medium-high-energy wide-range ion source 214 passes through the left vacuum chamber 216 to perform surface treatment on the etched substrate. The medium-high-energy wide-range ion beam is implanted at the position of the preset circuit pattern on the surface of the etched substrate, where the wide-energy-range metal ion in the medium-high-energy wide-range ion beam includes Ni (nickel) or Cu (copper). Then, a medium-low-energy wide-range ion beam generated by the first medium-low-energy wide-range ion source 204, the second medium-low-energy wide-range ion source 206 and the third medium-low-energy wide-range ion source 208 passes through the stainless steel chamber 207 to perform ultra-thin metal deposition. An obtained metal-deposited layer includes Ni or Cu and has a thickness of 1-2 nm. Finally, a low-energy ion beam generated by the low-energy ion source 212 passes through the lower right vacuum chamber 211 to perform thick metal deposition, to obtain a thick deposited layer, including Ni or Cu and having a thickness of 1-2 μm.

Further, step 4 specifically includes:

Step 401: use the medium-high-energy wide-range ion beam generated by the medium-high-energy wide-range ion source to perform surface treatment at the position of the preset circuit pattern on the surface of the etched substrate, to form a surface-treated substrate.

Figure 3:
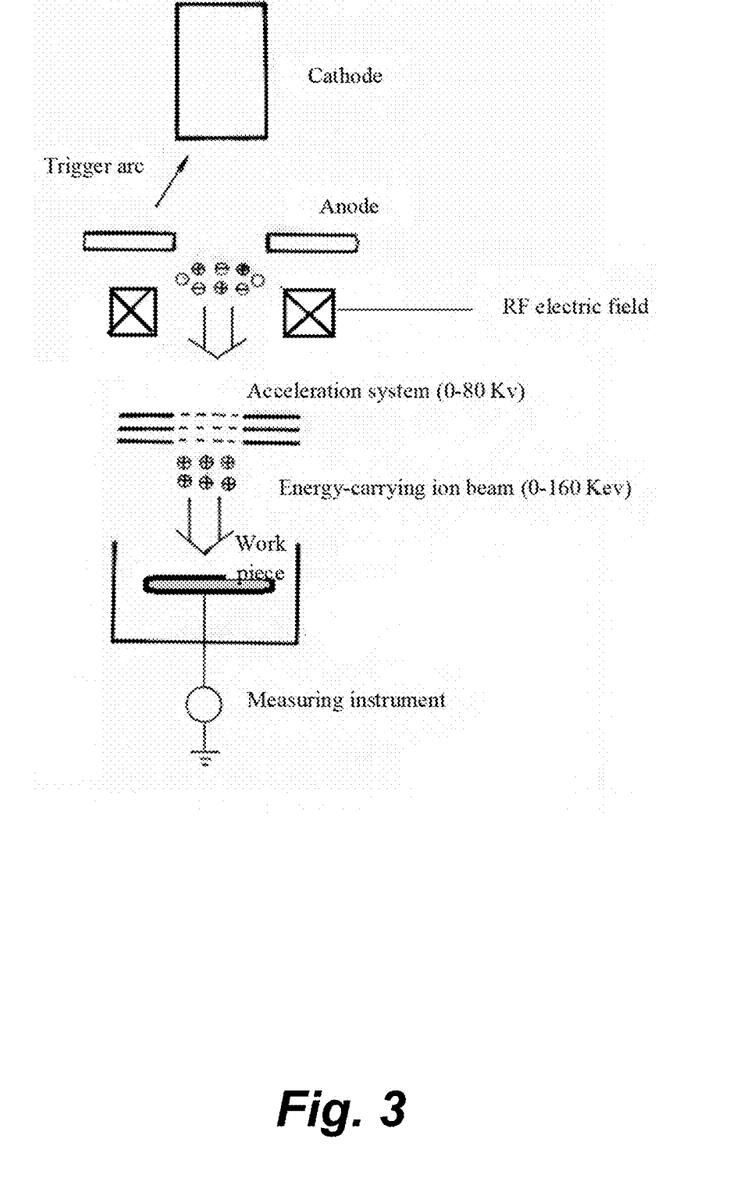
FIG. 3 is a schematic diagram of a medium-high-energy wide-range ion source of an ion beam lithography system provided by the present invention.

FIG. 3 is a schematic diagram of a medium-high-energy wide-range ion source of an ion beam lithography system provided by the present invention. As shown in FIG. 3, the medium-high-energy wide-range ion source forms a plasma by cathode pulse triggering, and the plasma is extracted through a magnetic tube. A medium-high-energy radio frequency (RF) power supply is provided outside a lead-out anode to generate a RF electric field. The medium-high-energy RF power supply has a current range of 0-1000 V and a frequency range of 0.1-3 MHz. After the plasma is formed by the pulse triggering, the plasma is first energy-broadened by the RF electric field, then separately accelerated in an acceleration system, and finally extracted to obtain a wide-range ion beam.

Specifically, the medium-high-energy wide-range ion source forms a plasma by cathode pulse triggering. An auxiliary RF power supply is provided outside the lead-out anode to excite the plasma by resonance. Then ions of different energies are extracted by a magnetic tube and passed through the acceleration system for a second acceleration, to finally obtain a medium-high-energy wide-range ion beam.

Specifically, step 401 includes: use the medium-high-energy wide-range ion source to implant a medium-high-energy wide-range ion beam at the position of the preset circuit pattern on the surface of the etched substrate, where an implantation voltage is 8-30 kV, a beam intensity is 1-10 mA, an implantation dose is $1\times10^{15}$ to $1\times10^{16}$ ions/cm$^2$, and an implantation depth is 70-120 nm.

Step 402: use the medium-low-energy wide-range ion beam generated by the medium-low-energy wide-range ion source to deposit an ultra-thin metal layer at the position of the preset circuit pattern on the surface of the surface-treated substrate, to form an ultra-thin metal layer deposited substrate.

Figure 4:
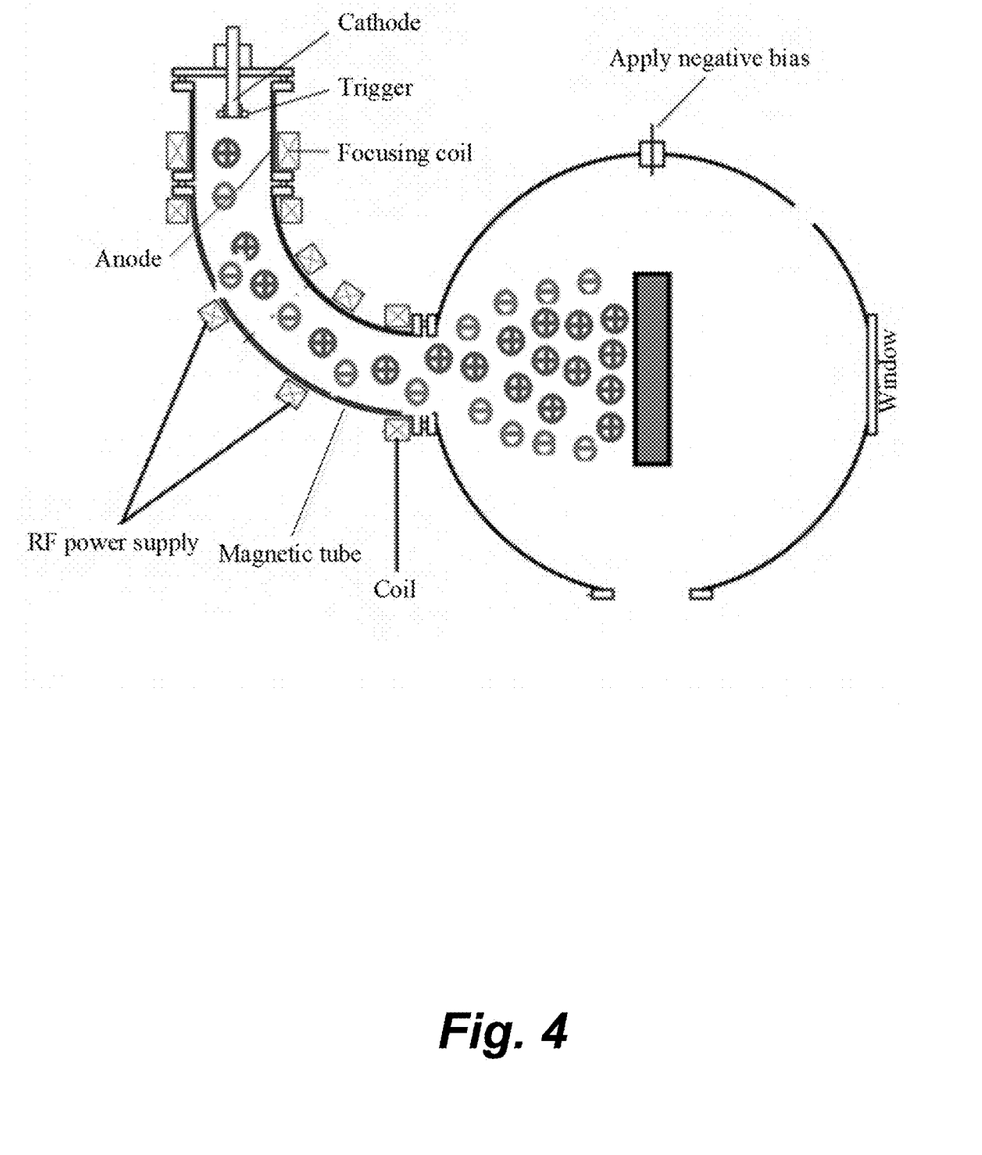
FIG. 4 is a structural diagram of a medium-low-energy wide-range ion source of an ion beam lithography system provided by the present invention.

FIG. 4 is a structural diagram of a medium-low-energy wide-range ion source of an ion beam lithography system provided by the present invention. As shown in FIG. 4, the medium-low-energy wide-range ion source forms a plasma by direct current (DC) triggering. The plasma is extracted through a magnetic tube. A medium-low-energy RF power supply is provided outside the extraction tube. The medium-low-energy RF power supply has a current range of 0-100 V and a frequency range of 0.1-3 MHz. Specifically, after the plasma is formed by the DC triggering, the plasma first passes through an anode tube to enter into a magnetic elbow. In the magnetic elbow, the plasma is selectively accelerated by a RF magnetic field to broaden the energy of the plasma. Then the plasma is extracted by a magnetic field generated by a coil. In the magnetic elbow, the plasma is always controlled by the magnetic field of the magnetic elbow. The magnetic field of the elbow is mainly to extract the medium-low-energy wide-range ion beam.

Specifically, step 402 includes: use the medium-low-energy wide-range ion source to deposit an ultra-thin metal layer at the position of the preset circuit pattern on the surface of the surface-treated substrate by means of magnetic filtration deposition to form an ultra-thin metal layer deposited substrate. During the magnetic filtration deposition, an arc current is 90-150 A and an elbow magnetic field current is 1.0-4.0 A. The arc current is a cathode arc striking current, and the elbow magnetic field current adopts the current intensity of the lead-out magnetic field.

Step 403: use a low-energy ion beam generated by the low-energy ion source to deposit a thick metal layer at the position of the preset circuit pattern on the surface of the ultra-thin metal layer deposited substrate, to form a metal film substrate.

Figure 5:
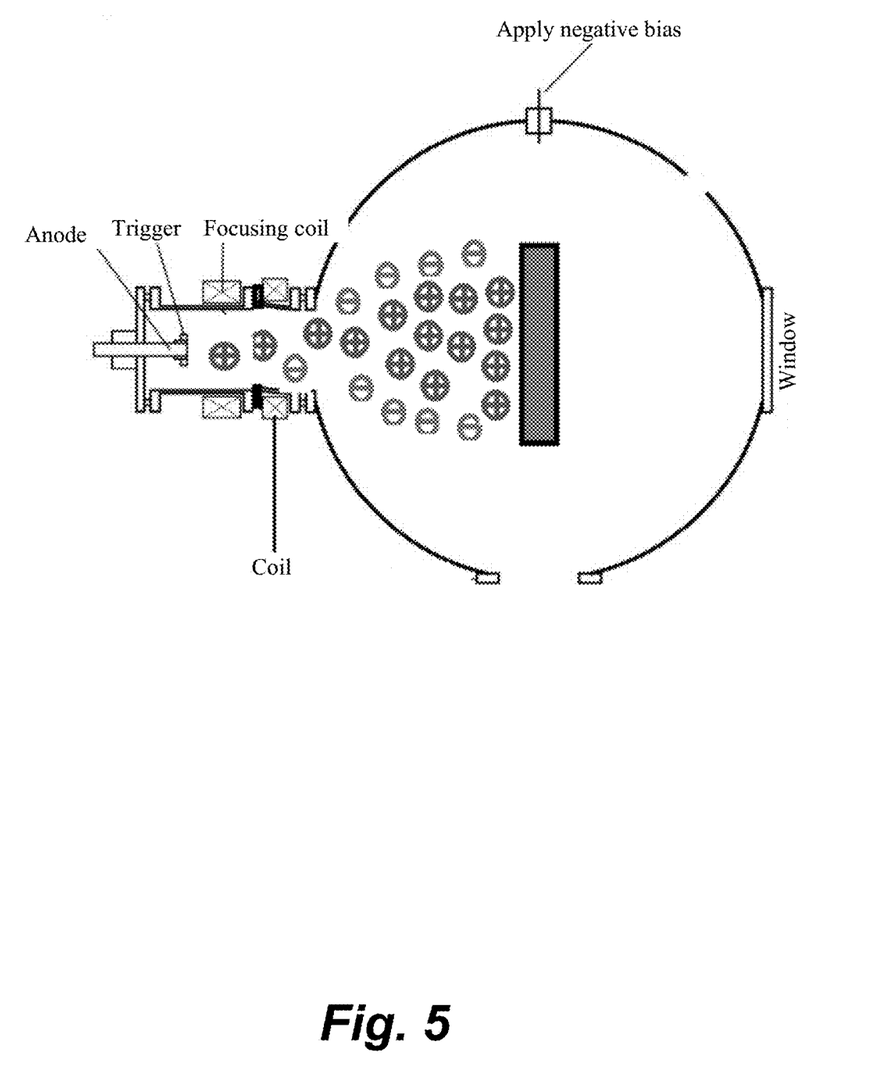
FIG. 5 is a structural diagram of a low-energy ion source of an ion beam lithography system provided by the present invention.

FIG. 5 is a structural diagram of a low-energy ion source of an ion beam lithography system provided by the present invention. As shown in FIG. 5, the low-energy ion source forms a plasma by DC triggering. The plasma is extracted through a magnetic tube. There is no RF power supply provided outside the magnetic extraction tube, but a coil is provided on the magnetic extraction tube to form a lead-out magnetic field.

Specifically, step 403 includes: use the low-energy ion source to further deposit a thick metal layer at the position of the preset circuit pattern on the surface of the ultra-thin metal layer deposited substrate by means of magnetic filtration deposition to form a metal film substrate. During the magnetic filtration deposition, an arc current is 100-150 A and an elbow magnetic field current is 2.0-4.0 A. The arc current is a cathode arc striking current, and the elbow magnetic field current adopts the current intensity of the lead-out magnetic field.

Step 5: strip the dry film off the surface of the metal film substrate to obtain a PCB.

After the treatment of the wide-energy-range ion beam is completed, the remaining dry film on the surface of the metal film substrate is stripped off to obtain a PCB (which is also called a printed wiring board, PWB) printed with a desired preset circuit pattern.

The present invention realizes the preparation of an ultra-fine circuit by using a wide-energy-range ion source based on the ion beam lithography system. The wide-energy-range ion beam lithography method of the present invention omits an etching process, and completely solves the technical bottleneck of difficult precision circuit forming.

The present invention realizes the wide energy range by the resonant excitation of the RF power supply provided outside the magnetic tube. The frequency of the RF power supply is scanned back and forth. Ions with different mass-to-charge ratios (m/z) are excited by the resonance of the RF power supply at different time periods to obtain energy for acceleration. Other m/z ions are not accelerated. Therefore, the energy obtained at different ion generation time periods is inconsistent, thereby forming a wide-energy-range ion beam.

By adopting the ion beam lithography method disclosed by the present invention, the present invention can prepare an ultra-fine circuit with a line width and a line spacing of less than 3 μm and a minimum copper foil thickness of 2 μm. The copper film of the circuit is deposited by an addition process which uses a wide-energy-range ion beam with an energy range of 30 ev to 20 Kev. Since the energy range is large and the deposited film is dense and smooth, the ion beam lithography method is suitable for applications such as high-frequency and high-speed transmission. In the wide-energy-range ion beam method, the differentiated obtaining of the energy is realized through the RF power supply, and the ions are accelerated by adsorbing the energy from the resonance by the radio frequency and the mass-to-charge ratio (m/z). The PCB prepared by the wide-range ion beam technique is environment-friendly. It overcomes the problem of environmental pollution caused by an etching liquid used by the conventional technique.

Compared with the prior art, the ion beam lithography method based on the ion beam lithography system disclosed by the present invention mainly has the following advantages:

1. The method deposits a wide-energy-range ion beam on the surface of the polymer substrate, and the medium-high-energy wide-range ion implantation forms a metal layer with a high bonding strength. Compared with the conventional technique, the method of the present invention mixes low, medium and high-energy ion beams to deposit the metals, achieving better energy selectivity, better deposition density and higher bonding strength. The high energy is directly implanted onto the polymer surface to form a mixed layer, which can be well chemically bonded with subsequent metals, thereby greatly increasing the bonding strength.

2. The method of the present invention uses the medium-high-energy wide-range energy ion beam, the medium-low-energy wide-range energy ion beam and the low-energy ion beam to treat the substrate in the printing process. The present invention performs energy control through parameters such as the voltage and radio frequency of the auxiliary RF power supply, which is obviously different from the conventional energy control. The frequency of the RF power supply used in the present invention is adjustable, and the frequency adjustment process realizes the acceleration and energization of ions with different mass-to-charge ratios (m/z).

3. The ultra-fine wide-energy-range ion beam lithography technique of the present invention only copper-plates the circuit pattern portion, so an etching process is not required to etch excess copper. Therefore, compared with the conventional technique, the ion beam lithography method avoids the use of an etching liquid that pollutes the environment and is difficult to handle, thereby realizing environmental friendliness.

4. The line width and spacing of the printed circuit prepared by the present invention are realized by nanoscale photolithography, which are much lower than the approximately 20 μm line width and spacing realized by the conventional technique. Therefore, the present invention is conducive to the lightweight and miniaturization of integrated circuits.

5. By introducing the wide energy range, the copper film prepared by the ion beam lithography method of the present invention has a high density and the prepared copper foil has a minimum thickness of 2 μm, which is much lower than the conventional minimum thickness of 7 μm.

6. The ion beam lithography method disclosed by the present invention realizes the preparation of a chip-on-film (COF) circuit that cannot be realized by the conventional technique. The preparation method of the present invention improves the circuit smoothness and quality, etc., and is suitable for the preparation of an ultra-fine COF circuit.

7. The ion beam lithography method based on the ion beam lithography system proposed by the present invention adopts a roll-roll processing method, which greatly increases the processing efficiency, increases the production capacity by 1-2 times compared with the conventional technique, and has a high yield.

Each embodiment of the present specification is described in a progressive manner, each embodiment focuses on the difference from other embodiments, and the same and similar parts between the embodiments may refer to each other.

In this paper, several examples are used for illustration of the principles and embodiments of the present invention. The description of the foregoing embodiments is used to help illustrate the method of the present invention and the core principles thereof. In addition, those skilled in the art can make various modifications in terms of specific embodiments and scope of application in accordance with the teachings of the present invention. In conclusion, the content of the present specification shall not be construed as a limitation to the present invention.

What is claimed is:

1. An ion beam lithography method based on an ion beam lithography system, wherein the ion beam lithography system comprises a medium-high-energy wide-range ion source, a medium-low-energy wide-range ion source, and a low-energy ion source; the ion beam lithography method comprising:
preparing a polyimide (PI) substrate;
coating a dry film on a surface of the PI substrate;
etching the dry film according to a preset circuit pattern to form an etched dry film;
using the ion beam lithography system to deposit a wide-energy-range metal ion on the preset circuit pattern of the etched dry film to form a metal film substrate; and
stripping the dry film off a surface of the metal film substrate to obtain a printed circuit board (PCB).

2. The ion beam lithography method based on the ion beam lithography system according to claim 1, wherein the wide-energy-range metal ion is a nickel or copper ion, and the wide-energy-range metal ion has an energy range of 30 ev to 20 Key.

3. The ion beam lithography method based on the ion beam lithography system according to claim 1, wherein using the ion beam lithography system to deposit a wide-energy-range metal ion on the preset circuit pattern of the etched dry film to form a metal film substrate comprises:
using a medium-high-energy wide-range ion beam generated by the medium-high-energy wide-range ion source to perform surface treatment at a position of the preset circuit pattern on a surface of the etched dry film, to form a surface-treated substrate;
using a medium-low-energy wide-range ion beam generated by the medium-low-energy wide-range ion source to deposit an ultra-thin metal layer at the position of the preset circuit pattern on a surface of the surface-treated substrate, to form an ultra-thin metal layer deposited substrate; and
using a low-energy ion beam generated by the low-energy ion source to deposit a thick metal layer at the position of the preset circuit pattern on a surface of the ultra-thin metal layer deposited substrate, to form the metal film substrate.

4. The ion beam lithography method based on the ion beam lithography system according to claim 3, wherein using a medium-high-energy wide-range ion beam generated by the medium-high-energy wide-range ion source to perform surface treatment at a position of the preset circuit pattern on a surface of the etched dry film to form a surface-treated substrate comprises:
using the medium-high-energy wide-range ion source to implant the medium-high-energy wide-range ion beam at the position of the preset circuit pattern on the surface of the etched dry film, wherein an implantation voltage is 8-30 kV, a beam intensity is 1-10 mA, an implantation dose is $1\times10^{15}$ to $1\times10^{16}$ ions/cm$^2$, and an implantation depth is 70-120 nm.

5. The ion beam lithography method based on the ion beam lithography system according to claim 3, wherein using a medium-low-energy wide-range ion beam generated by the medium-low-energy wide-range ion source to deposit an ultra-thin metal layer at the position of the preset circuit pattern on a surface of the surface-treated substrate to form an ultra-thin metal layer deposited substrate comprises:
using the medium-low-energy wide-range ion source to deposit the ultra-thin metal layer at the position of the preset circuit pattern on the surface of the surface-treated substrate by means of magnetic filtration deposition to form the ultra-thin metal layer deposited substrate, wherein the magnetic filtration deposition uses an arc current of 90-150 A and an elbow magnetic field current of 1.0-4.0 A.

6. The ion beam lithography method based on the ion beam lithography system according to claim 3, wherein using a low-energy ion beam generated by the low-energy ion source to deposit a thick metal layer at the position of the preset circuit pattern on a surface of the ultra-thin metal layer deposited substrate to form a metal film substrate comprises:
using the low-energy ion source to further deposit the thick metal layer at the position of the preset circuit pattern on the surface of the ultra-thin metal layer deposited substrate by means of magnetic filtration deposition to form the metal film substrate, wherein the magnetic filtration deposition uses an arc current of 100-150 A and an elbow magnetic field current of 2.0-4.0 A.

7. The ion beam lithography method based on the ion beam lithography system according to claim 3, wherein the medium-high-energy wide-range ion source forms a plasma by cathode pulse triggering; the plasma is extracted through a magnetic tube; a medium-high-energy radio frequency (RF) power supply is provided outside a lead-out anode; and the medium-high-energy RF power supply has a current range of 0-1000 V and a frequency range of 0.1-3 MHz.

8. The ion beam lithography method based on the ion beam lithography system according to claim 3, wherein the medium-low-energy wide-range ion source forms a plasma by direct current (DC) triggering; the plasma is extracted through a magnetic tube; a medium-low-energy RF power supply is provided outside an extraction tube; and the medium-low-energy RF power supply has a current range of 0-100 V and a frequency range of 0.1-3 MHz.

9. The ion beam lithography method based on the ion beam lithography system according to claim 3, wherein the low-energy ion source forms a plasma by DC triggering; the plasma is extracted through a magnetic tube; no RF power supply is provided outside the magnetic tube; and a lead-out magnetic field is provided on the extraction tube.

* * * * *